United States Patent
Gao (10) Patent No.: US 12,203,970 B2
(45) Date of Patent: Jan. 21, 2025

(54) DISPLAY SYSTEM AND DISPLAY SYSTEM DETECTION METHOD

(71) Applicant: SHENZHEN CHINA STAR OPTOELECTRONICS SEMICONDUCTOR DISPLAY TECHNOLOGY CO., LTD., Guangdong (CN)

(72) Inventor: Xuanquan Gao, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/758,015

(22) PCT Filed: May 5, 2022

(86) PCT No.: PCT/CN2022/090885
§ 371 (c)(1),
(2) Date: Jun. 26, 2022

(87) PCT Pub. No.: WO2023/197383
PCT Pub. Date: Oct. 19, 2023

(65) Prior Publication Data
US 2024/0192259 A1    Jun. 13, 2024

(30) Foreign Application Priority Data
Apr. 11, 2022    (CN) .......................... 202210380848.6

(51) Int. Cl.
*G01R 31/08*    (2020.01)
*H02H 7/00*    (2006.01)

(52) U.S. Cl.
CPC ............. *G01R 31/08* (2013.01); *H02H 7/008* (2013.01)

(58) Field of Classification Search
CPC ....... G01R 31/08; G06F 13/38; G06F 13/385; G06F 13/4068; G06F 13/4282; G06F 1/266; H01R 12/72; H01R 12/725; H04L 12/10
(Continued)

(56) References Cited

U.S. PATENT DOCUMENTS

2015/0362944 A1* 12/2015 Sporck ................... H02M 1/00
                                                                        323/303
2018/0062326 A1*  3/2018 Card ..................... H01R 12/725

FOREIGN PATENT DOCUMENTS

CN    202372576 U    8/2012
CN    108982998 A   12/2018
(Continued)

OTHER PUBLICATIONS

International Search Report in International application No. PCT/CN2022/090885, mailed on Nov. 25, 2022.
(Continued)

*Primary Examiner* — Danny Nguyen
(74) *Attorney, Agent, or Firm* — PV IP PC; Wei Te Chung (57) ABSTRACT

A display system and a display system detection method are provided. The display system includes: a main control unit configured to output a first detection signal to a switch unit, and calculate the connection resistance according to a connection voltage and a detection current; a switch unit configured to control the cable to generate a detection current and a detection voltage according to the first detection signal; a constant current control unit configured to stabilize the detection current and the detection voltage; and a voltage
(Continued)

detection unit configured to generate a connection voltage according to the detection voltage, and send the connection voltage and the detection current to the main control unit.

20 Claims, 3 Drawing Sheets

(58) Field of Classification Search
USPC .................................................... 361/62–69
See application file for complete search history.

(56) References Cited

FOREIGN PATENT DOCUMENTS

| | | |
|---|---|---|
| CN | 110187186 A | 8/2019 |
| CN | 212845610 U | 3/2021 |
| CN | 215340141 U | 12/2021 |
| JP | H03146879 A | 6/1991 |

OTHER PUBLICATIONS

Written Opinion of the International Search Authority in International application No. PCT/CN2022/090885,mailed on Nov. 25, 2022.

* cited by examiner

DISPLAY SYSTEM AND DISPLAY SYSTEM DETECTION METHOD

FIELD OF INVENTION

The present application relates to the field of display technology, and in particular, to a display system and a display system detection method.

BACKGROUND OF INVENTION

In an active-matrix organic light-emitting diode (AMO-LED), a liquid-crystal display (LCD), a micro liquid-crystal display (Micro-LED), and a mini liquid-crystal display (Mini-LED) based display systems based on timing controllers (ie, TCON), cables are required for electrical connection between the main control board (such as control board) and the controlled board (such as X-board). A power transmission and a signal transmission between the main control board and the controlled board are related to a connection resistance of the cable, therefore, the cable has a reasonable connection resistance, which is a necessary condition for a stable operation of the display system.

However, a conventional detection circuit only detects a connection between the control board and the X-board, and cannot monitor a change of the connection resistance of the cable due to factors such as vibration, contact oxidation and cable aging during long-term use, resulting in the display system cannot clearly perceive a cable status, and it is difficult to ensure a stability of the display system.

SUMMARY OF INVENTION

The present application is mainly aimed at the technical problem of how to monitor a change of a connection resistance of the cable.

In view of this, the present application provides a display system and a display system detection method that can dynamically detect changes in connection resistance in real time, thereby sensing a current state of the cable and ensuring a stability of a main control board and a controlled board.

According to one aspect of the present application, a display system is provided, wherein the display system includes a main control board and a controlled board, wherein the main control board is electrically connected to the controlled board through a cable, and wherein the main control board includes a connection resistance detection circuit, and wherein the connection resistance detection circuit is configured to detect a connection resistance between the main control board and the controlled board, and wherein the connection resistance detection circuit including:

- a main control unit configured to output a first detection signal to a switch unit, and calculate the connection resistance according to a connection voltage and a detection current;
- a switch unit electrically connected to the cable and the main control unit, wherein the switch unit is configured to control the cable to generate a detection current and a detection voltage according to the first detection signal;
- a constant current control unit electrically connected with the cable, wherein the constant current control unit is configured to stabilize the detection current and the detection voltage; and
- a voltage detection unit electrically connected to the cable and the main control unit, wherein the voltage detection unit is configured to generate a connection voltage according to the detection voltage, and send the connection voltage and the detection current to the main control unit.

Further, the main control board is provided with a first contact terminal and a second contact terminal contact with the cable, and the controlled board is provided with a third contact terminal and a fourth contact terminal contact with the cable;

wherein the first contact terminal, the third contact terminal, the fourth contact terminal, and the second contact terminal form a closed loop in sequence, and wherein the connection resistance is an equivalent resistance of the closed loop.

Further, the first contact terminal is electrically connected to the switch unit, and the second contact terminal is electrically connected to the constant current control unit;

wherein the detection voltage includes a detection input voltage and a detection output voltage, and wherein the detection input voltage is a voltage of the first contact terminal, the detection output voltage is a voltage of the second contact terminal.

Further, the switch unit includes a first transistor, a second transistor, and a first resistor;

wherein a first port of the first transistor is electrically connected to one terminal of the first resistor and a third port of the second transistor, wherein a second port of the first transistor is electrically connected to the first contact terminal, and wherein a third port of the first transistor is electrically connected to another terminal of the first resistor and a first power supply; and wherein a first port of the second transistor is electrically connected to the main control unit, and wherein a second port of the second transistor is grounded.

Further, the constant current control unit includes a first amplifier, a third transistor, a fourth resistor, a fifth resistor, and a sixth resistor, wherein a positive input terminal of the first amplifier is electrically connected to a second port of the third transistor and one terminal of the sixth resistor;

wherein a negative input terminal of the first amplifier is electrically connected to one terminal of the fourth resistor and one terminal of the fifth resistor, and wherein an output terminal of the first amplifier is electrically connected to a first port of the third transistor;

wherein a third port of the third transistor is electrically connected to the second contact terminal;

wherein another terminal of the fourth resistor is electrically connected to a second power supply; and wherein another terminal of the fifth resistor and another terminal of the sixth resistor are both grounded.

Further, the voltage detection unit includes a second amplifier, a seventh resistor, an eighth resistor, a ninth resistor, and a tenth resistor, wherein a positive input terminal of the second amplifier is electrically connected to one terminal of the seventh resistor and one terminal of the eighth resistor, another terminal of the seventh resistor is grounded, and another terminal of the eighth resistor is electrically connected to the first contact terminal; and wherein a negative input terminal of the second amplifier is electrically connected to one terminal of the ninth resistor and one terminal of the tenth resistor, another terminal of the ninth resistor is electrically connected to the second contact terminal, and another terminal of the tenth resistor is electrically connected to the output terminal of the second amplifier.

Further, the connection resistance detection circuit further includes an analog-to-digital conversion unit, wherein the analog-to-digital conversion unit is electrically connected to the voltage detection unit and the main control unit; and
wherein an input terminal of the analog-to-digital conversion unit is electrically connected to the output terminal of the second amplifier, and wherein an output terminal of the analog-to-digital conversion unit is electrically connected to the main control unit.

Further, the main control unit further includes a processor, wherein the processor is electrically connected to the output terminal of the analog-to-digital conversion unit, and wherein the processor is configured to calculate the connection resistance according to the connection voltage and the detected current.

Further, the main control unit further includes a judging unit, the judging unit is electrically connected to the processor, and the judging unit is configured to determine a state of the cable according to the connection resistance and preset resistance intervals.

Further, the main control unit further includes an adjustment unit, wherein the adjustment unit is electrically connected to the judging unit, and wherein the adjustment unit is configured to adjust an operating mode of the main control board and the controlled board according to the state of the cable.

According to another aspect of the present application, a display system detection method is provided, wherein the display system detection method is applied to the display system, and wherein the display system detection method includes:
obtaining the first detection signal;
generating the detection current and the detection voltage according to the first detection signal, and keeping the detection current and the detection voltage stable;
generating the connection voltage according to the detection voltage; and
calculating the connection resistance according to the connection voltage and detection current.

Further, the step of generating the detection current and the detection voltage according to the first detection signal, and keeping the detection current and the detection voltage stable, includes:
outputting the first detection signal to the first contact terminal between the main control board and the controlled board to generate a detection current and a detection voltage; and
outputting the detection current to the second contact terminal between the main control board and the controlled board to keep the detection current and the detection voltage stable.

Further, the step of generating the connection voltage according to the detection voltage includes:
obtaining a detection output voltage of the second contact terminal; and
generating a connection voltage according to the detection output voltage.

Further, the step of obtaining the detection output voltage of the second contact terminal includes:
obtaining a second power supply, a resistance of a fourth resistor, and a resistance of a fifth resistor; and
obtaining a detection output voltage according to the second power supply, the resistance of the fourth resistor, and the resistance of the fifth resistor.

Further, the step of generating the connection voltage according to the detection output voltage includes:
obtaining the detection input voltage, a resistance of a ninth resistor, and a resistance of a tenth resistor of the first contact terminal; and
obtaining the connection voltage according to the detected input voltage, the detection output voltage, the resistance of the ninth resistor, and the resistance of the tenth resistor.

Further, the step of calculating the connection resistance according to the connection voltage and the detection current includes:
obtaining the detection current according to the detection output voltage and the resistance of the tenth resistor; and
obtaining the connection resistance according to the connection voltage and the detection current.

Further, the step of obtaining the connection resistance according to the connection voltage and the detection current includes:
performing an analog-to-digital conversion on the connection voltage and detection current to obtain the connection voltage and detection current in digital form; and
obtaining the connection resistance according to the connection voltage and the detection current in the digital form.

Further, the display system detection method further includes:
determining the state of the cable according to the connection resistance and preset resistance intervals; and
adjusting the operating mode of the main control board and the controlled board according to the state of the cable.

Further, the step of determining the state of the cable according to the connection resistance and the preset resistance interval, including:
determining the state of the cable is stable when a resistance value of the connection resistor is less than or equal to a first voltage threshold;
determining the state of the cable is degraded when the resistance value of the connection resistor is greater than a first voltage threshold and less than or equal to a second voltage threshold;
determining the state of the cable is unstable when the resistance value of the connection resistor is greater than the second voltage threshold; and
determining the state of the cable is fault when the resistance value of the connection resistor is equal to a third voltage threshold.

Further, the step of adjusting the operating modes of the main control board and the controlled board according to the state of the cable, including:
turning off the main control board and the controlled board in the event of the cable is failure.

By outputting a first detection signal from the main control unit to the switch unit, controlling the cable to generate a detection current and a detection voltage according to the first detection signal, at the same time using a constant current control unit to keep the detection current and the detection voltage stable, and generating a connection voltage according to the detection voltage by voltage detection unit, the main control unit can calculate the connection resistance according to the connection voltage and the detection current, and can dynamically detect a change of the connection resistance in real time, therefore, the current state of the cable is sensed to ensure a stability of the main control board and the controlled board.

DESCRIPTION OF FIGURES

The technical solutions and other beneficial effects of the present application will be apparent through the detailed description of the specific embodiments of the present application in conjunction with the accompanying figures.

DETAILED DESCRIPTION OF EMBODIMENTS

The technical solutions in the embodiments of the present application will be clearly and completely described below with reference to the accompanying drawings in the embodiments of the present application. Obviously, the described embodiments are only a part of the embodiments of the present application, but not all of the embodiments. Based on the embodiments in the present application, all other embodiments obtained by those skilled in the art without inventive steps fall within a protection scope of the present application.

In the description of the present application, it should be understood that the terms "center", "longitudinal", "lateral", "length", "width", "thickness", "upper", "lower", "front", "rear", "left", "right", "vertical", "horizontal", "top", "bottom", "inside", "outside", etc. indicate an orientation or positional relationship based on the orientation or position shown in the figures. The relation is only for a convenience of describing the present application and simplifying the description, rather than indicating or implying that the device or element referred to must have a unique orientation, be constructed and operated with a specific orientation, and therefore cannot be interpreted as a limitation to the present application. In addition, the terms "first" and "second" are only used for descriptive purposes, and should not be understood as indicating or implying relative importance or indicating the number of indicated technical features. Thus, a feature defined as "first", "second" may explicitly or implicitly include one or more features. In the description of the present application, "plurality" means two or more, unless otherwise expressly and specifically defined.

In the description of this application, it should be noted that, unless otherwise expressly specified and limited, the terms "installed", "connected" and "amounted" should be understood in a broad sense, for example, it may be a fixed connection, a detachable connection, or an integral connection; it can be a mechanical connection, an electrical connection or can be communicate with each other; it can be a direct connection or an indirect connection through an intermediate medium; it can be an internal communication of two elements or an interaction of two elements relation. For those of ordinary skill in the art, the specific meanings of the above terms in the present application can be understood according to specific situations.

The following disclosure provides many different embodiments or examples for implementing different structures of the present application. To simplify the disclosure of the present application, the components and arrangements of specific examples are described below. Of course, they are only examples and are not intended to limit the application. Furthermore, the present application may repeat reference numerals and/or reference letters in different instances for a purpose of simplicity and clarity, and does not in itself indicate a relationship between the various embodiments and/or arrangements discussed. In addition, the present application provides examples of various specific processes and materials, but one of ordinary skill in the art will recognize the present application of other processes and/or the use of other materials. In some embodiments, methods, means, components and circuits well known to those skilled in the art have not been described in detail, to highlight a subject matter of the present application.

The present application mainly provides a display system, the display system includes a main control board and a controlled board. The main control board is electrically connected to the controlled board through a cable. The main control board includes a connection resistance detection circuit. The connection resistance detection circuit is configured to detect a connection resistance between the main control board and the controlled board. The connection resistance detection circuit includes: a main control unit configured to output a first detection signal to a switch unit, and calculate the connection resistance according to the a connection voltage and a detection current; a switch unit electrically connected to the cable and the main control unit, wherein the switch unit is configured to control the cable to generate a detection current and a detection voltage according to the first detection signal; a constant current control unit, electrically connected to the cable, wherein the constant current control unit is configured to stabilize the detection current and the detection voltage; a voltage detection unit electrically connected to the cable and the main control unit, wherein the voltage detection unit is configured to generate a connection voltage according to the detection voltage, and send the connection voltage and detection current to the main control unit.

By outputting a first detection signal from the main control unit to the switch unit, controlling the cable to generate the detection current and the detection voltage according to the first detection signal, and at the same time using the constant current control unit to keep the detection current and the detection voltage stable, and using the voltage detection unit to generate the connection voltage according to the detection voltage, the main control unit can calculate the connection resistance according to the connection voltage and detection current. Therefore, the present application can dynamically detect a change of the connection resistance in real time, and then sense a current cable to ensure the stability of the main control board and the controlled board.

Figure 1:
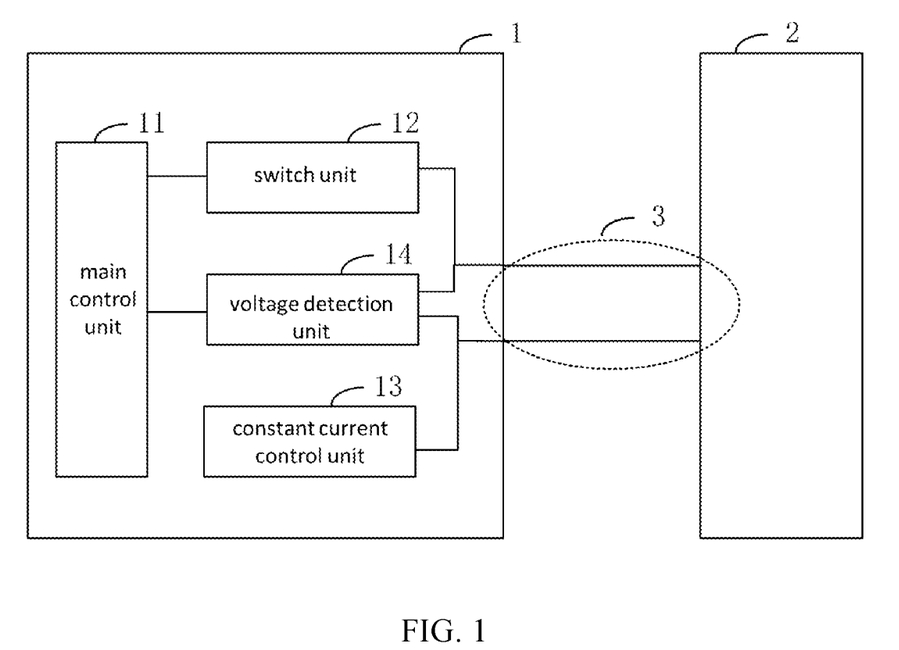
FIG. 1 shows a block diagram of a connection resistance detection circuit according to one embodiment of the present application.

FIG. 1 shows a block diagram of the connection resistance detection circuit according to one embodiment of the present application.

As shown in FIG. 1, the connection resistance detection circuit of the embodiment of the present application includes a main control unit 11, a switch unit 12, a constant current control unit 13, and a voltage detection unit 14. The connection resistance detection circuit can be provided in the main control board 1. The main control board 1 can be electrically connected to a controlled board 2 by a cable 3.

Further, the main control board is provided with a first contact terminal and a second contact terminal which are contact with the cable, and the controlled board is provided with a third contact terminal and a fourth contact terminal which are contact with the cable, wherein the first contact terminal, the third contact terminal, the fourth contact terminal, and the second contact terminal form a closed-loop in sequence, and wherein the connection resistance is an equivalent resistance of the closed-loop loop.

Figure 2:
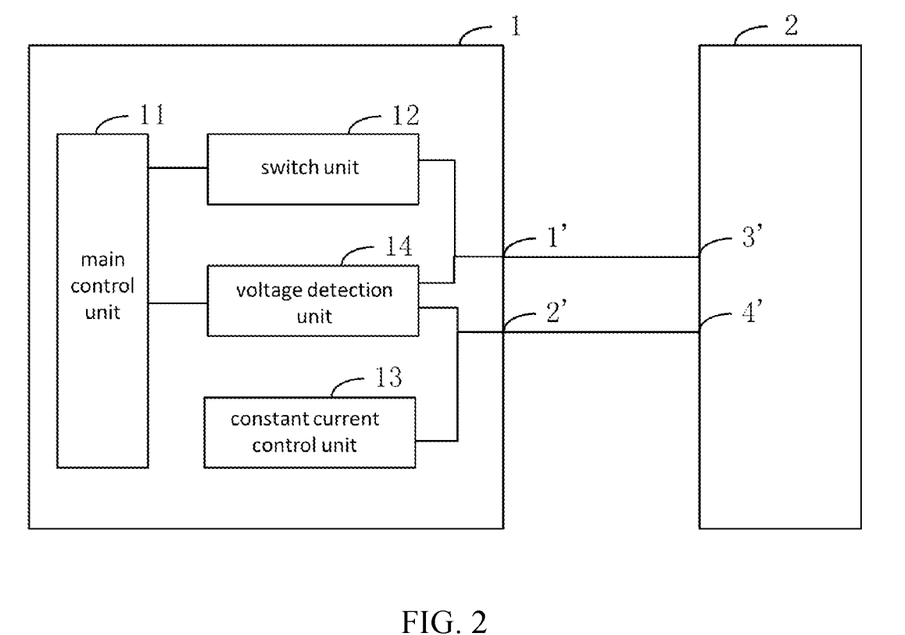
FIG. 2 shows a block diagram of a connection resistance detection circuit according to one embodiment of the present application.

FIG. 2 shows a block diagram of a connection resistance detection circuit according to one embodiment of the present application.

Referring to FIG. 2, the cable exemplarily includes two wires, i.e., an output wire and an input wire. The output wire is between the first contact terminal 1' and the third contact terminal 3'. The detection voltage sent from the switch unit by the first contact terminal 1' can be loaded on the cable. The input wire is between the second contact terminal 2' and the fourth contact terminal 4'. A current on the cable can flow into the constant current control unit through the second contact terminal 2', so that the constant current control unit controls the current of the cable remains stable.

It should be noted that, a number of wires included in the cable may be determined according to actual needs, multiple output wires or multiple input wires can be combined for processing when there are multiple cables. It can be understood that the present application does not limit the number of the wires.

Further, the first contact terminal is electrically connected to the switch unit, and the second contact terminal is electrically connected to the constant current control unit. The detection voltage includes a detection input voltage and a detection output voltage. The detection input voltage is a voltage of the first contact terminal, and the detection output voltage is a voltage of the second contact terminal.

In order to more clearly illustrate the specific structure and operating principle of the connection resistance detection circuit according to the embodiment of the present application, further description will be provided below with reference to FIG. 3.

Figure 3:
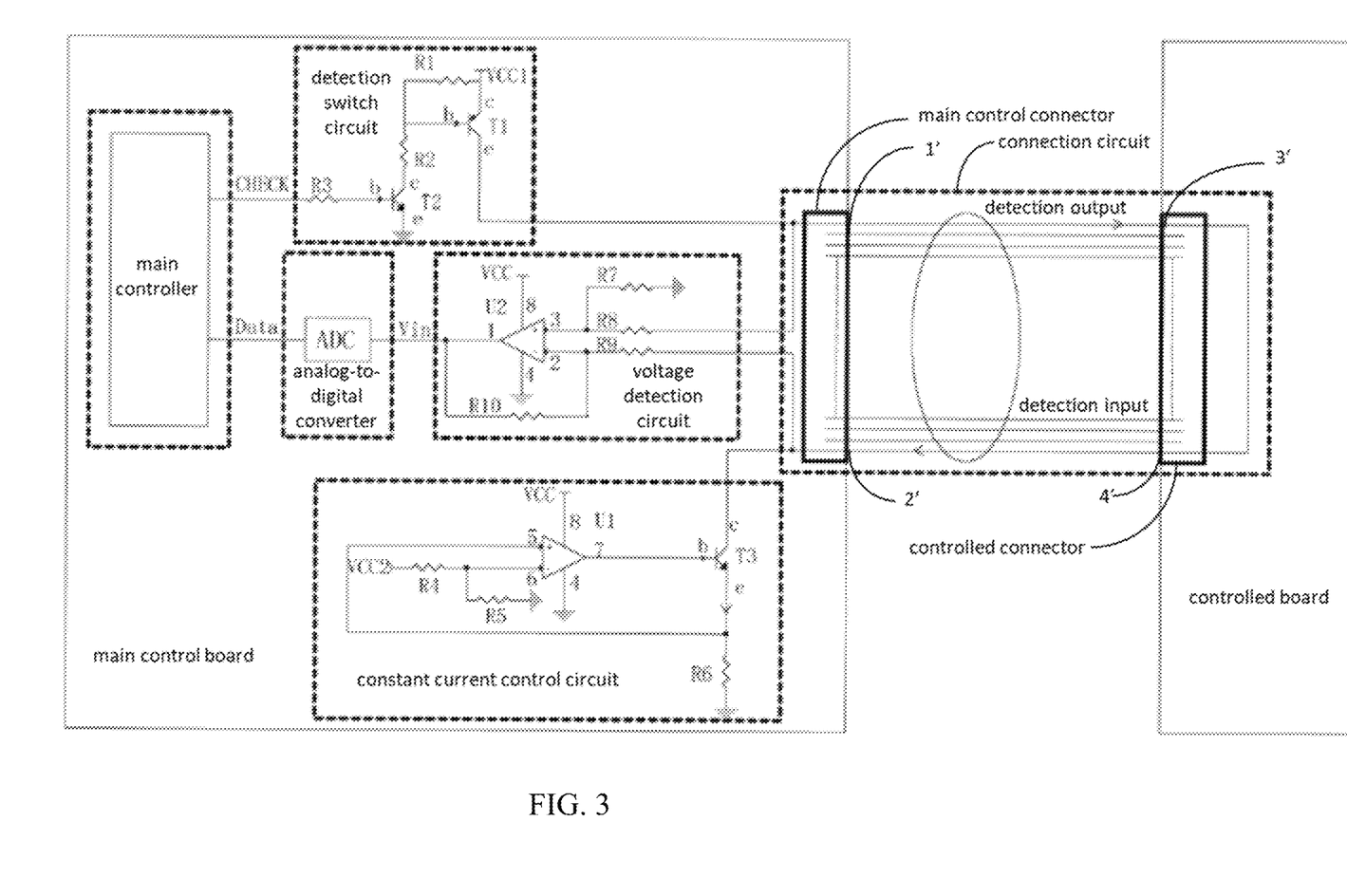
FIG. 3 shows a schematic diagram of a connection resistance detection circuit according to one embodiment of the present application.

FIG. 3 shows a schematic diagram of a connection resistance detection circuit according to one embodiment of the present application.

As shown in FIG. 3, the main control board is provided with a main control connection interface (i.e., a main control connector), and the controlled board is provided with a controlled connection interface (i.e., a controlled connector). The first contact terminal 1' and the second contact terminal 2' may be the two terminals of the main control connection interface, and the third contact terminal 3' and the fourth contact terminal 4' may be the two terminals of the controlled connection interface. The main control connection interface is electrically connected to the controlled connection interface through the cable, and the connection circuit includes the main control connection interface, the controlled connection interface, and the cable.

Further, the main control unit may output the first detection signal (i.e., CHECK) to the switch unit. The switch unit (i.e., the detection switch circuit) receives the first detection signal, and provide the detection voltage to the first contact terminal 1' in the main control connection interface according to the first detection signal, and then generate the detection current on the cable. detection. The detection voltage and the detection current can be output to the controlled board, and the controlled board input the detection voltage and the detection current to the second contact terminal 2' in the main control connection interface. In one embodiment, the third contact terminal 3' of the controlled connection interface may be short-circuited with the fourth contact terminal 4', that is, the detection voltage and detection current output by the cable and the detection voltage and detection current input by the cable can be the same.

Further, the switch unit includes a first transistor, a second transistor, and a first resistor. A first port of the first transistor is electrically connected to one terminal of the first resistor and a third port of the second transistor. A second port of the first transistor is electrically connected to the first contact terminal. A third port of the first transistor is electrically connected to another terminal of the first resistor and a first power supply. A first port of the two transistor is electrically connected to the main control unit. A second port of the second transistor is grounded.

It should be noted that the transistor in the embodiments of the present application may be a bipolar junction transistor (BJT) or a field effect transistor (FET). It can be understood that the embodiments of the present application do not limit the types of transistors.

Referring to FIG. 3, the first port of the first transistor T1 may be a base b, the second port of the first transistor T1 may be an emitter, and the third port of the first transistor may be a collector c. The first transistor T1 may be electrically connected to the first power source VCC1. The emitter of the first transistor T1 may be electrically connected to the first contact terminal 1'.

Further, the base of the second transistor T2 may receive the first detection signal CHECK. The first detection signal may be a square wave. The second transistor T2 and the first transistor T1 are turned on in sequence when the first detection signal is at a high level. At this time, a detection voltage can be formed at the first contact terminal 1' and a detection current can be formed on the cable for further detection.

In addition, in FIG. 3, a first resistor R1, a second resistor R2, and a third resistor R3 are also provided. The first resistor R1, the second resistor R2, and the third resistor R3 can be adjusted according to the types of the first transistor and the second transistor. It can be understood that the present application does not limit the resistance values of the first resistor R1, the second resistor R2, and the third resistor R3.

Further, the constant current control unit includes a first amplifier, a third transistor, a fourth resistor, a fifth resistor, and a sixth resistor. A positive input terminal of the first amplifier is electrically connected to a second port of the third transistor and one terminal of the sixth resistor. A negative input terminal of the first amplifier is electrically connected to one terminal of the fourth resistor and one terminal of the fifth resistor. An output terminal of the first amplifier is electrically connected to a first port of the third transistor. A third port of the third transistor is electrically connected to the second contact terminal. Another terminal of the fourth resistor is electrically connected to a second power supply. Another terminal of the fifth resistor and another terminal of the sixth resistor are both grounded.

Referring to FIG. 3, the constant current control unit (the constant current control circuit) includes a first amplifier U1, a third transistor T3, a fourth resistor R4, a fifth resistor R5, and a sixth resistor R6. A positive input terminal of the first amplifier (a port 5 of U1) is electrically connected to a second port of the third transistor (an emitter e of T3), and one terminal of the sixth resistor. A negative input terminal of the first amplifier (a port 6 of U1) is electrically connected to the fourth resistor and one terminal of the fifth resistor. An output terminal of the first amplifier (a port 7 of U1) is electrically connected to a first terminal of the third transistor. Another terminal of the fourth resistor is electrically connected to a second power source VCC2.

During actual operation, the constant current control unit can receive the detection current from the second contact terminal 2' to keep the detection current stable, to ensure an accuracy of calculating the connection resistance.

Further, the voltage detection unit includes a second amplifier, a seventh resistor, an eighth resistor, a ninth resistor, and a tenth resistor. A positive input terminal of the second amplifier is electrically connected to one terminal of the seventh resistor and one terminal of the eighth resistor. Another terminal of the seventh resistor is grounded. Another terminal of the eighth resistor is electrically connected to the first contact terminal. A negative input terminal of the second amplifier is electrically connected to one terminal of the ninth resistor and one terminal of the tenth resistor, another terminal of the ninth resistor is electrically connected to the second contact terminal, and another terminal of the tenth resistor is electrically connected to the output terminal of the second amplifier.

Referring to FIG. 3, the voltage detection unit (i.e., the voltage detection circuit) includes a second amplifier U2, a seventh resistor R7, an eighth resistor R8, a ninth resistor R9, and a tenth resistor R10. A positive input terminal (i.e., port 3 of U2) is electrically connected to one terminal of the seventh resistor and one terminal of the eighth resistor. Another terminal of the seventh resistor is grounded, and another terminal of the eighth resistor is electrically connected to the first contact terminal. A negative input terminal of the second amplifier (i.e., port 2 of U2) is electrically connected to one terminal of the ninth resistor and one terminal of the tenth resistor. Another terminal of the ninth resistor is electrically connected to the second contact terminal. Another terminal of the tenth resistor is electrically connected to the output terminal of the second amplifier (i.e., port 1 of U2).

It should be noted that a first amplifier U1 and a second amplifier U2 also need their own power supply. Through port 4 and port 8, power can be supplied to the first amplifier U1 and the second amplifier U2, so that the first amplifier U1 and the second amplifier U2 can operate normally. The first amplifier U1 and the second amplifier U2 may be different types and therefore may supply different power sources.

Exemplarily, a voltage of the first contact terminal may be V1, and a voltage of the second contact terminal may be V2, wherein V2 can be calculated by the following formula:

$$V2=VCC2*R5/(R4+R5);$$

Further, the detection current I can be calculated by the following formula:

$$I=V2/R10;$$

Further, the connection voltage Vin can be calculated by the following formula:

$$Vin=(V2-V1)*R10/R9;$$

wherein R8=R9, R10=R7;

Further, the connection resistance Rconnect can be calculated by the following formula:

$$Rconnect=Vin/I.$$

Further, the connection resistance detection circuit further includes an analog-to-digital conversion unit. The analog-to-digital conversion unit is electrically connected to the voltage detection unit and the main control unit. An input terminal of the analog-to-digital conversion unit is electrically connected to the output terminal of the second amplifier. An output terminal of the analog-to-digital conversion unit is electrically connected to the main control unit.

In practical applications, the analog-to-digital conversion unit may be implemented by an analog-to-digital converter. The analog-to-digital conversion unit can also be integrated Inside some processors. It can be understood that there are many types of analog-to-digital converters, and the present application does not limit the specific implementation of the analog-to-digital conversion unit.

Figure 4:
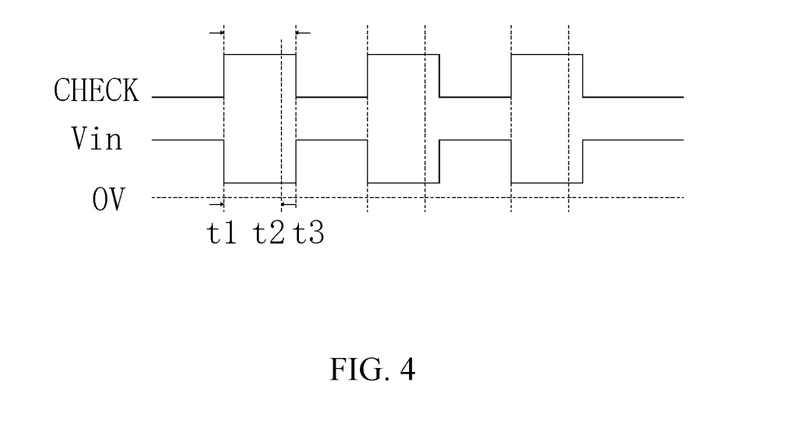
FIG. 4 shows a schematic diagram of a first detection signal according to one embodiment of the present application.

FIG. 4 shows a schematic diagram of the first detection signal according to one embodiment of the present application.

As shown in FIG. 4, the first detection signal CHECK may be change from a low electrical potential to a high electrical potential at time t1, thereby turning on the switch unit. The detection voltage and the detection current are rapidly generated on the cable when the switch unit is turned on. The detection voltage is inverted and amplified by the voltage detection unit to obtain the input voltage Vin input to the analog-to-digital conversion unit. At time t2, the analog-to-digital conversion unit control the input voltage Vin to be converted into voltage data Data, to further calculate the connection resistance. After receiving the voltage data Data, the main control unit turn off the switch unit at time t3, and then calculate the connection resistance.

Further, the main control unit further includes a processor. The processor is electrically connected to the output terminal of the analog-to-digital conversion unit, and the processor is configured to calculate the connection resistance according to the connection voltage and the detected current.

Further, the main control unit further includes a judging unit. The judging unit is electrically connected to the processor, and the judging unit is configured to determine a state of the cable according to the connection resistance and preset resistance intervals.

Figure 5:
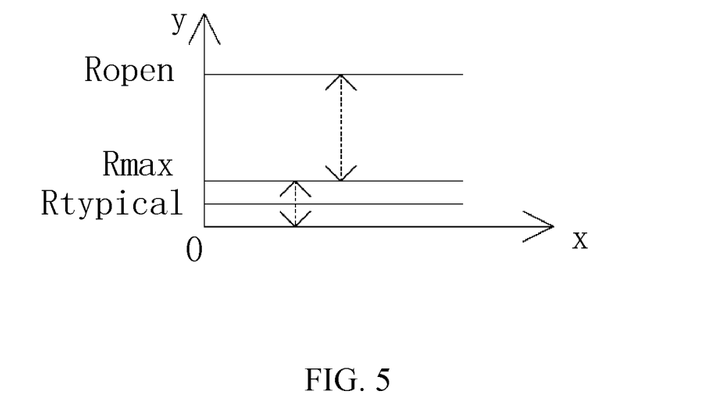
FIG. 5 shows a schematic diagram of a resistance interval of one embodiment of the present application.

FIG. 5 shows a schematic diagram of resistance intervals of one embodiment of the present application.

As shown in FIG. 5, a horizontal axis represents time, a vertical axis represents voltage value. Rtypical is a first voltage threshold. Rmax is a second voltage threshold. Ropen is a third voltage threshold.

Exemplarily, the connection quality of the cable is excellent, stable and reliable when the resistance value of the connection resistor Rconnect is less than or equal to the first voltage threshold, the connection performance of the cable is deteriorated and in a usable state when the resistance value of the connection resistor Rconnect is greater than the first voltage threshold and less than or equal to the second voltage threshold, the connection of the cable is unstable and cannot be used when the resistance value of the connection resistor Rconnect is greater than the second voltage threshold value, the connection of the cable is open and faulty when the resistance value of the connection resistor Rconnect is equal to the third voltage threshold.

Therefore, various states such as open circuit connection, connection deterioration, and reliable connection of the cable can be identified by measuring the connection resistance between the main control board and the controlled board in the embodiment of the present application, which is beneficial to accurately evaluate the connector in the development stage, the rationality and quality of cable design and selection, real-time evaluation of the aging of connectors and cables in the product application stage, to clarify the expected stable working state of the product.

Further, the main control unit further includes an adjustment unit. The adjustment unit is electrically connected with the judging unit, and the adjustment unit is configured to adjust the working modes of the main control board and the controlled board according to the state of the cable. For example, the power supply of the main control unit and the controlled unit can be turned off and the operate can be suspended when the connection of the cable is open and there is a fault.

By outputting a first detection signal from the main control unit to the switch unit, and controlling the cable to generate a detection current and a detection voltage according to the first detection signal, and at the same time using a constant current control unit to keep the detection current and the detection voltage stable, and generating a connection voltage according to the detection voltage by voltage detection unit, so that the main control unit can calculate the connection resistance according to the connection voltage and the detection current, and can dynamically detect a change of the connection resistance in real time, therefore, the current state of the cable is sensed to ensure a stability of the main control board and the controlled board, and the display system is suitable for various application scenarios such as AMOLED, LCD, Micro-LED and Mini-LED.

To sum up, the embodiment of the present application determines the state of the cable by detecting the connection resistance between the main control board and the controlled board, which is simple and convenient. At the same time, the embodiment of the present application can set the detection current through the resistance voltage division according to the connection requirements of the circuit, and output the input voltage suitable for analog conversion according to the detection voltage and detection current of the circuit, and configure the amplification factor of the operational amplifier through the resistance. Finally, the connection resistance is calculated according to the set current, voltage magnification and analog-to-digital conversion values. In addition, the switch unit is closed immediately after each detection is completed to realize real-time resistance detection with small energy consumption. In addition, the connection loops of the main control board and the controlled board are positioned on both sides of the connector, which can well represent the characteristics of the connection circuit, and then can perform aging detection and stability evaluation on the connection performance of the cable to realize its life calculation.

In the above-mentioned embodiments, the description of each embodiment has its own emphasis. For parts that are not described in detail in a certain embodiment, reference may be made to the relevant descriptions of other embodiments.

The display system provided by the embodiments of the present application has been introduced in detail above, and the principles and implementations of the present application are described in this article by using specific examples. The core idea, those of ordinary skill in the art should understand that: it is still possible to modify the technical solutions recorded in the foregoing embodiments, or perform equivalent replacements to some of the technical features; and these modifications or replacements do not make the corresponding technical solutions. The essence of the invention deviates from a scope of the technical solutions of the embodiments of the present application.

What is claimed is:

1. A display system, wherein the display system comprises a main control board and a controlled board, wherein the main control board is electrically connected to the controlled board through a cable, wherein the main control board comprises a connection resistance detection circuit, wherein the connection resistance detection circuit is configured to detect a connection resistance between the main control board and the controlled board, and wherein the connection resistance detection circuit comprising:
   a main control unit configured to output a first detection signal to a switch unit and calculate the connection resistance according to a connection voltage and a detection current;
   the switch unit electrically connected to the cable and the main control unit, wherein the switch unit is configured to control the cable to generate the detection current and a detection voltage according to the first detection signal;
   a constant current control unit electrically connected to the cable, wherein the constant current control unit is configured to stabilize the detection current and the detection voltage; and
   a voltage detection unit electrically connected to the cable and the main control unit, wherein the voltage detection unit is configured to generate the connection voltage according to the detection voltage, and send the connection voltage and the detection current to the main control unit.

2. The display system according to claim 1, wherein the main control board is provided with a first contact terminal and a second contact terminal in contact with the cable, and the controlled board is provided with a third contact terminal and a fourth contact terminal in contact with the cable; and
   wherein the first contact terminal, the third contact terminal, the fourth contact terminal, and the second contact terminal form a closed loop in sequence, and wherein the connection resistance is an equivalent resistance of the closed loop.

3. The display system according to claim 2, wherein the first contact terminal is electrically connected to the switch unit, and the second contact terminal is electrically connected to the constant current control unit; and
   wherein the detection voltage comprises a detection input voltage and a detection output voltage, wherein the detection input voltage is a voltage of the first contact terminal, and wherein the detection output voltage is a voltage of the second contact terminal.

4. The display system according to claim 3, wherein the switch unit comprises a first transistor, a second transistor, and a first resistor;
   wherein a first port of the first transistor is electrically connected to one terminal of the first resistor and a third port of the second transistor, wherein a second port of the first transistor is electrically connected to the first contact terminal, and wherein a third port of the first transistor is electrically connected to another terminal of the first resistor and a first power supply; and
   wherein a first port of the second transistor is electrically connected to the main control unit, and wherein a second port of the second transistor is grounded.

5. The display system according to claim 4, wherein the constant current control unit comprises a first amplifier, a third transistor, a fourth resistor, a fifth resistor, and a sixth resistor,
   wherein a positive input terminal of the first amplifier is electrically connected to a second port of the third transistor and one terminal of the sixth resistor;
   wherein a negative input terminal of the first amplifier is electrically connected to one terminal of the fourth resistor and one terminal of the fifth resistor, and wherein an output terminal of the first amplifier is electrically connected to a first port of the third transistor;

wherein a third port of the third transistor is electrically connected to the second contact terminal;

wherein another terminal of the fourth resistor is electrically connected to a second power supply; and wherein another terminal of the fifth resistor and another terminal of the sixth resistor are both grounded.

6. The display system according to claim 5, wherein the voltage detection unit comprises a second amplifier, a seventh resistor, an eighth resistor, a ninth resistor, and a tenth resistor, wherein a positive input terminal of the second amplifier is electrically connected to one terminal of the seventh resistor and one terminal of the eighth resistor, wherein another terminal of the seventh resistor is grounded, wherein another terminal of the eighth resistor is electrically connected to the first contact terminal; and wherein a negative input terminal of the second amplifier is electrically connected to one terminal of the ninth resistor and one terminal of the tenth resistor, wherein another terminal of the ninth resistor is electrically connected to the second contact terminal, and wherein another terminal of the tenth resistor is electrically connected to the output terminal of the second amplifier.

7. The display system according to claim 6, wherein the connection resistance detection circuit further comprises an analog-to-digital conversion unit electrically connected to the voltage detection unit and the main control unit; and wherein an input terminal of the analog-to-digital conversion unit is electrically connected to the output terminal of the second amplifier, and wherein an output terminal of the analog-to-digital conversion unit is electrically connected to the main control unit.

8. The display system according to claim 7, wherein the main control unit further comprises a processor electrically connected to the output terminal of the analog-to-digital conversion unit, and wherein the processor is configured to calculate the connection resistance according to the connection voltage and the detected current.

9. The display system according to claim 8, wherein the main control unit further comprises a judging unit electrically connected to the processor, and wherein the judging unit is configured to determine a state of the cable according to the connection resistance and preset resistance intervals.

10. The display system according to claim 9, wherein the main control unit further comprises an adjustment unit electrically connected to the judging unit, and wherein the adjustment unit is configured to adjust an operating mode of the main control board and the controlled board according to the state of the cable.

11. A display system detection method, wherein the display system detection method is applied to the display system according to claim 1, and wherein the display system detection method comprises:

obtaining the first detection signal;

generating the detection current and the detection voltage according to the first detection signal and keeping the detection current and the detection voltage stable;

generating the connection voltage according to the detection voltage; and calculating the connection resistance according to the connection voltage and the detection current.

12. The display system detection method according to claim 11, wherein the main control board is provided with a first contact terminal and a second contact terminal in contact with the cable, and the controlled board is provided with a third contact terminal and a fourth contact terminal in contact with the cable; and wherein the first contact terminal, the third contact terminal, the fourth contact terminal, and the second contact terminal form a closed loop in sequence, and wherein the connection resistance is an equivalent resistance of the closed loop; and wherein the step of generating the detection current and the detection voltage according to the first detection signal, and keeping the detection current and the detection voltage stable, comprises:

outputting the first detection signal to the first contact terminal between the main control board and the controlled board to generate the detection current and the detection voltage; and outputting the detection current to the second contact terminal between the main control board and the controlled board, to keep the detection current and the detection voltage stable.

13. The display system detection method according to claim 12, wherein the first contact terminal is electrically connected to the switch unit, and the second contact terminal is electrically connected to the constant current control unit;

wherein the detection voltage comprises a detection input voltage and a detection output voltage, wherein the detection input voltage is a voltage of the first contact terminal, and wherein the detection output voltage is a voltage of the second contact terminal; and wherein the step of generating the connection voltage according to the detection voltage comprises:

obtaining the detection output voltage of the second contact terminal; and generating the connection voltage according to the detection output voltage.

14. The display system detection method according to claim 13, wherein the switch unit comprises a first transistor, a second transistor, and a first resistor;

wherein a first port of the first transistor is electrically connected to one terminal of the first resistor and a third port of the second transistor, wherein a second port of the first transistor is electrically connected to the first contact terminal, and wherein a third port of the first transistor is electrically connected to another terminal of the first resistor and a first power supply; and wherein a first port of the second transistor is electrically connected to the main control unit, and wherein a second port of the second transistor is grounded;

wherein the constant current control unit comprises a first amplifier, a third transistor, a fourth resistor, a fifth resistor, and a sixth resistor, wherein a positive input terminal of the first amplifier is electrically connected to a second port of the third transistor and one terminal of the sixth resistor;

wherein a negative input terminal of the first amplifier is electrically connected to one terminal of the fourth resistor and one terminal of the fifth resistor, and wherein an output terminal of the first amplifier is electrically connected to a first port of the third transistor;

wherein a third port of the third transistor is electrically connected to the second contact terminal;

wherein another terminal of the fourth resistor is electrically connected to a second power supply; and wherein another terminal of the fifth resistor and another terminal of the sixth resistor are both grounded; and wherein the step of obtaining the detection output voltage of the second contact terminal comprises:

obtaining the second power supply, a resistance of the fourth resistor, and a resistance of the fifth resistor; and obtaining the detection output voltage according to the second power supply, the resistance of the fourth resistor and the resistance of the fifth resistor.

15. The display system detection method according to claim 13, wherein the voltage detection unit comprises a second amplifier, a seventh resistor, an eighth resistor, a ninth resistor, and a tenth resistor, and wherein a positive input terminal of the second amplifier is electrically connected to one terminal of the seventh resistor and one terminal of the eighth resistor, wherein another terminal of the seventh resistor is grounded, wherein another terminal of the eighth resistor is electrically connected to the first contact terminal;

wherein a negative input terminal of the second amplifier is electrically connected to one terminal of the ninth resistor and one terminal of the tenth resistor, and wherein the other terminal of the ninth resistor is electrically connected to the second contact terminal, and wherein the other terminal of the tenth resistor is electrically connected to the output terminal of the second amplifier; and wherein the step of generating the connection voltage according to the detection output voltage comprises:

obtaining the detection input voltage, a resistance of the ninth resistor and a resistance of the tenth resistor of the first contact terminal;

obtaining the connection voltage according to the detected input voltage, the detected output voltage, the resistance of the ninth resistor and the resistance of the tenth resistor.

16. The display system detection method according to claim 14, wherein the step of calculating the connection resistance according to the connection voltage and the detection current comprises:

obtaining the detection current according to the detection output voltage and the resistance of the tenth resistor; and obtaining the connection resistance according to the connection voltage and the detection current.

17. The display system detection method according to claim 15, wherein the connection resistance detection circuit further comprises an analog-to-digital conversion unit electrically connected to the voltage detection unit and the main control unit; and wherein an input terminal of the analog-to-digital conversion unit is electrically connected to the output terminal of the second amplifier, and wherein an output terminal of the analog-to-digital conversion unit is electrically connected to the main control unit;

wherein the main control unit further comprises a processor electrically connected to the output terminal of the analog-to-digital conversion unit, and wherein the processor is configured to calculate the connection resistance according to the connection voltage and the detected current; and wherein the step of obtaining the connection resistance according to the connection voltage and the detection current comprises:

performing an analog-to-digital conversion on the connection voltage and detection current to obtain the connection voltage and detection current in a digital form; and obtaining the connection resistance according to the connection voltage and the detection current in the digital form.

18. The display system detection method according to claim 17, wherein the main control unit further comprises a judging unit electrically connected to the processor, and wherein the judging unit is configured to determine a state of the cable according to the connection resistance and preset resistance intervals;

wherein the main control unit further comprises an adjustment unit electrically connected to the judging unit, and wherein the adjustment unit is configured to adjust an operating mode of the main control board and the controlled board according to the state of the cable;

wherein the display system detection method further comprises:

determining a state of the cable according to the connection resistance and preset resistance intervals; and adjusting the operating mode of the main control board and the controlled board according to the state of the cable.

19. The display system detection method according to claim 18, wherein the step of determining the state of the cable according to the connection resistance and the preset resistance interval, comprises:

determining the state of the cable is stable when the resistance value of the connection resistor is less than or equal to a first voltage threshold;

determining the state of the cable is degraded when the resistance value of the connection resistor is greater than the first voltage threshold and less than or equal to a second voltage threshold;

determining the state of the cable is unstable when the resistance value of the connection resistor is greater than the second voltage threshold; and determining the state of the cable is fault when the resistance value of the connection resistor is equal to a third voltage threshold.

20. The display system detection method according to claim 18, wherein the step of adjusting the operating modes of the main control board and the controlled board according to the state of the cable, comprises:

turning off the main control board and the controlled board when the cable is failure.

* * * * *